United States Patent
Lopez et al.

(10) Patent No.: US 10,377,264 B2
(45) Date of Patent: Aug. 13, 2019

(54) VEHICLE CONDUCTIVE CHARGE PORT HAVING COOLING INFRASTRUCTURE

(71) Applicant: Ford Global Technologies, LLC, Dearborn, MI (US)

(72) Inventors: Juan Lopez, Madison Heights, MI (US); Nondo G. Basoukeas, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 189 days.

(21) Appl. No.: 14/610,308

(22) Filed: Jan. 30, 2015

(65) Prior Publication Data
US 2016/0221458 A1    Aug. 4, 2016

(51) Int. Cl.
| | |
|---|---|
| *B60L 53/16* | (2019.01) |
| *B60L 11/18* | (2006.01) |
| *H05K 7/20* | (2006.01) |
| *B60L 53/14* | (2019.01) |
| *B60L 53/302* | (2019.01) |

(52) U.S. Cl.
CPC .............. *B60L 53/14* (2019.02); *B60L 53/16* (2019.02); *B60L 53/302* (2019.02); *H05K 7/20927* (2013.01); *Y02T 10/7005* (2013.01); *Y02T 10/7072* (2013.01); *Y02T 90/14* (2013.01)

(58) Field of Classification Search
CPC ............................. B60L 11/1816; B60L 53/16
USPC ........................................................ 320/109
See application file for complete search history.

(56) References Cited

U.S. PATENT DOCUMENTS

| | | | |
|---|---|---|---|
| 5,408,209 A | 4/1995 | Tanzer et al. | |
| 5,412,304 A | 5/1995 | Abbott | |
| 5,548,200 A | 8/1996 | Nor et al. | |
| 5,594,315 A | 1/1997 | Ramos et al. | |
| 5,670,860 A * | 9/1997 | Conrady | H02J 7/0042 174/15.6 |
| 5,684,380 A * | 11/1997 | Woody | B60L 11/182 320/108 |
| 5,909,099 A * | 6/1999 | Watanabe | A61K 31/726 320/108 |
| 6,175,212 B1 * | 1/2001 | Oguri | H01F 27/2876 320/104 |
| 6,396,241 B1 * | 5/2002 | Ramos | B60L 11/1816 174/47 |
| 8,098,044 B2 * | 1/2012 | Taguchi | B60L 11/1816 320/109 |
| 8,118,147 B2 | 2/2012 | Ori et al. | |
| 8,174,235 B2 * | 5/2012 | Dyer | B60L 11/1809 180/65.21 |
| 8,350,526 B2 * | 1/2013 | Dyer | B60L 1/003 320/104 |
| 8,723,477 B2 | 5/2014 | Gaul et al. | |

(Continued)

FOREIGN PATENT DOCUMENTS

JP         2012256480 A     12/2012

*Primary Examiner* — Jerry D Robbins
(74) *Attorney, Agent, or Firm* — David B. Kelley; Brooks Kushman P.C.

(57) ABSTRACT

A vehicle conductive charge port is configured to conductively transfer charging current from an external source to the vehicle for charging a traction battery of the vehicle. A cooling system is configured to cool the charge port depending on a temperature of the charge port. The cooling system may use coolant and/or air to cool the charge port.

10 Claims, 4 Drawing Sheets

(56) References Cited

U.S. PATENT DOCUMENTS

| | | | |
|---|---|---|---|
| 8,965,716 B2* | 2/2015 | Ley | G01K 15/00 |
| | | | 702/60 |
| 9,287,646 B2* | 3/2016 | Mark | H01R 13/00 |
| 9,321,362 B2* | 4/2016 | Woo | B60L 11/1818 |
| 9,451,723 B2* | 9/2016 | Lofy | H05K 7/20136 |
| 2010/0156355 A1 | 6/2010 | Bauerle et al. | |
| 2011/0204849 A1 | 8/2011 | Mukai et al. | |
| 2013/0335024 A1 | 12/2013 | Akai et al. | |
| 2014/0042968 A1 | 2/2014 | Hiroe | |
| 2014/0081490 A1 | 3/2014 | Adelman | |
| 2014/0179164 A1 | 6/2014 | Kanamori et al. | |
| 2014/0217978 A1 | 8/2014 | Gellert | |
| 2014/0266038 A1 | 9/2014 | Gilbeau et al. | |
| 2015/0054460 A1* | 2/2015 | Epstein | B60L 11/187 |
| | | | 320/109 |
| 2016/0107530 A1 | 4/2016 | Roberts et al. | |

* cited by examiner

VEHICLE CONDUCTIVE CHARGE PORT HAVING COOLING INFRASTRUCTURE

TECHNICAL FIELD

The present disclosure relates to conductive charging of electric vehicles.

BACKGROUND

Electric and plug-in hybrid vehicles include a traction battery. The battery may be charged by plugging a charge connector of a power source into a conductive charge port of the vehicle. Charging current from the power source conducts through the connected charge connector and charge port to the battery. The conduction of the charging current may heat the charge port and surrounding vehicle environment.

SUMMARY

An assembly for charging a traction battery of a vehicle includes a charge port and a cooling system. The charge port is configured to conductively transfer charging current from an external source to the vehicle. The cooling system is configured to cool the charge port depending on a temperature of the charge port.

The cooling system may include a temperature sensor configured to monitor the temperature of the charge port.

In one variation, the cooling system is a liquid cooling system configured to use coolant to cool the charge port. In this variation, the liquid cooling system may include a cold plate having a coolant chamber with a coolant ingress port and a coolant egress port, the cold plate being attached to the charge port. The liquid cooling system may further include a heat exchanger configured to cool heated coolant and the liquid cooling system may be further configured to provide a flow of coolant through the coolant chamber of the cold plate for absorbing heat from the charge port and to the heat exchanger.

In another variation, the cooling system is an air cooling system configured to use air to cool the charge port. The air cooling system may be a forced air cooling system configured to provide a forced flow of air toward the charge port to dissipate heat from the charge port into an environment of the charge port. The air cooling system may be a natural air convection system. In either case, the air cooling system may further include a heat-sink device attached to the charge port to absorb heat of the charge port and dissipate the heat into an environment of the charge port.

A method for charging a traction battery of a vehicle includes transferring charging current from an external source to the vehicle conductively through a charge port. The method further includes cooling the charge port, by a cooling system configured to cool the charge port, depending on a temperature of the charge port.

A vehicle includes a traction battery, a charge port, and a cooling system. The charge port is configured to conductively transfer charging current from an external source to the traction battery. The cooling system is configured to cool the charge port depending on a temperature of the charge port.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
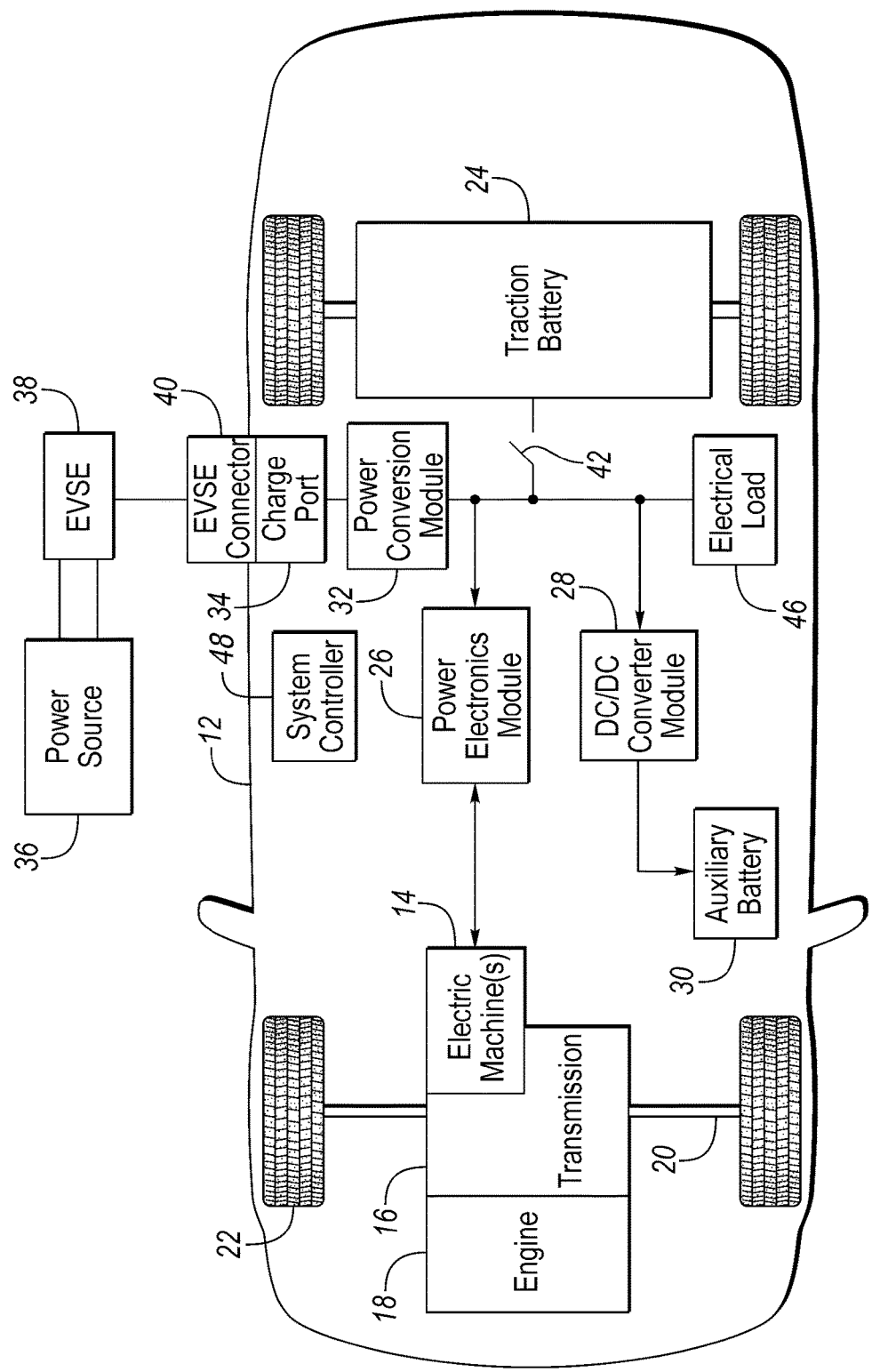
FIG. 1 illustrates a block diagram of a plug-in hybrid electric vehicle (PHEV) illustrating typical drivetrain and energy storage components.

Referring now to FIG. 1, a block diagram of a plug-in hybrid electric vehicle (PHEV) 12 illustrating typical drivetrain and energy storage components is shown. Vehicle 12 includes one or more electric machines 14 mechanically connected to a transmission 16. Electric machines 14 may be capable of operating as a motor or a generator. Transmission 16 is mechanically connected to an engine 18. Transmission 16 is also mechanically connected to a drive shaft 20 that is mechanically connected to wheels 22. Electric machines 14 can provide propulsion and deceleration capability when engine 18 is turned on or off. Electric machines 14 also act as generators and can provide fuel economy benefits by recovering energy that would normally be lost as heat in the friction braking system. Electric machines 14 may also reduce vehicle emissions by allowing engine 18 to operate at more efficient speeds and allowing vehicle 12 to be operated in electric mode with engine 18 off under certain conditions.

A traction battery 24 stores energy that can be used by electric machines 14. Battery 24 typically provides a high voltage DC output. Battery 24 is electrically connected to one or more power electronics modules 26. One or more contactors 42 may isolate battery 24 from other components when opened and connect battery 24 to other components when closed. Power electronics module 26 is also electrically connected to electric machines 14 and provides the ability to bi-directionally transfer energy between battery 24 and electric machines 14. For example, a typical battery 24 may provide a DC voltage while electric machines 14 may operate using a three-phase AC current. Power electronics module 26 may convert the DC voltage to a three-phase AC current for use by electric machines 14. In a regenerative mode, power electronics module 26 may convert the three-phase AC current from electric machines 14 acting as generators to the DC voltage compatible with battery 24. The description herein is equally applicable to a pure electric vehicle. For a pure electric vehicle, transmission 16 may be a gear box connected to an electric machine 14 and engine 18 may not be present.

In addition to providing energy for propulsion, battery 24 may provide energy for other vehicle electrical systems. A typical system may include a DC/DC converter module 28 that converts the high voltage DC output of battery 24 to a low voltage DC supply that is compatible with other vehicle loads. Other high-voltage loads 46, such as compressors and electric heaters, may be connected directly to the high-voltage without the use of a DC/DC converter module 28. The low-voltage systems may be electrically connected to an auxiliary battery 30 (e.g., 12V battery).

Vehicle 12 may be an electric vehicle or a plug-in hybrid vehicle in which battery 24 may be recharged by an external power source 36. External power source 36 may be a connection to an electrical outlet that receives utility power. External power source 36 may be electrically connected to electric vehicle supply equipment (EVSE) 38. EVSE 38 may provide circuitry and controls to regulate and manage the transfer of energy between external power source 36 and vehicle 12. External power source 36 may provide DC or AC electric power to EVSE 38. EVSE 38 may have a charge connector 40 for plugging into a charge port 34 of vehicle 12.

Charge port 34 is an inlet component of on-board charging infrastructure of vehicle 12. Charge port 34 may be any type of conductive charge port configured to conductively transfer charging current from EVSE 38 to vehicle 12. Charging current may be transferred from EVSE 38 to vehicle 12 conductively through charge connector 40 and charge port 34 when charge connector 40 is plugged into charge port 34. Charge port 34 is electrically connected to battery 24. For instance, charge port 34 is electrically connected to battery 24 through an on-board power conversion module 32 (i.e., charger). Charger 32 may condition the power supplied from EVSE 38 to provide the proper voltage and current levels to battery 24. Charger 32 may interface with EVSE 38 to coordinate the delivery of power to vehicle 12. Charge connector 40 may have terminals with recesses that mate with corresponding pins of charge port 34.

As an example, charge connector 40 and charge port 34 meet the specifications defined in Society of Automotive Engineering Specification SAE J1772 such as SAE J1772 combo connector specification. Alternatively, charge connector 40 and charge port 34 may be configured differently such as to meet the CHAdeMO plug specification, the European IEC 62196 specification, or other specifications.

The various components discussed may have one or more associated controllers to control and monitor the operation of the components. The controllers may communicate via a serial bus (e.g., Controller Area Network (CAN)) or via discrete conductors. A system controller 48 may be present to coordinate the operation of the various components.

Figure 2:
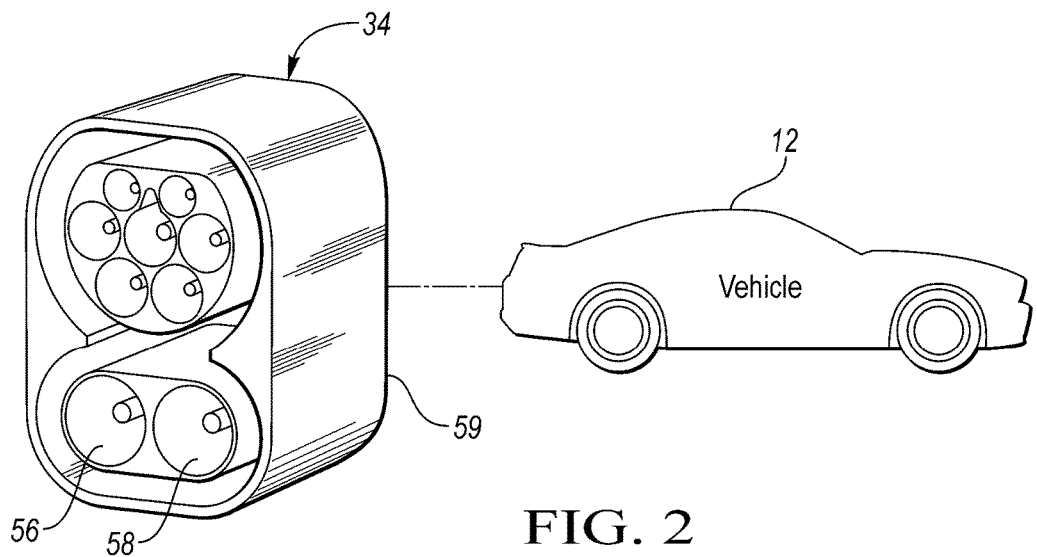
FIG. 2 illustrates an assembly diagram of a vehicle conductive charge port.

Referring now to FIG. 2, with continual reference to FIG. 1, a schematic diagram of charge port 34 of vehicle 12 is shown. As an example, charge port 34 as shown in FIG. 2 has the European interface pursuant to IEC 62196. As another example, charge port 34 has the United States interface pursuant to SAE J1772. In any event, charge port 34 includes a first DC pin (DC$^+$) 56 and a second DC pin (DC) 58. Charge port 34 includes a housing 59 forming a structural portion of the charge port.

Terminals of charge connector 40 mate with charge port pins 56 and 58 when charge connector 40 is plugged into charge port 34. Charging current from EVSE 38 to vehicle 12 is electrically conducted through the mated charge connector terminals and charge port pins 56 and 58. The conduction of the charging current may generate heat which may heat up components of charge port 34 including charge port housing 59.

Various embodiments of the present disclosure include control strategy configurations for cooling charge port 34 during the conductive charging process.

Figure 3:
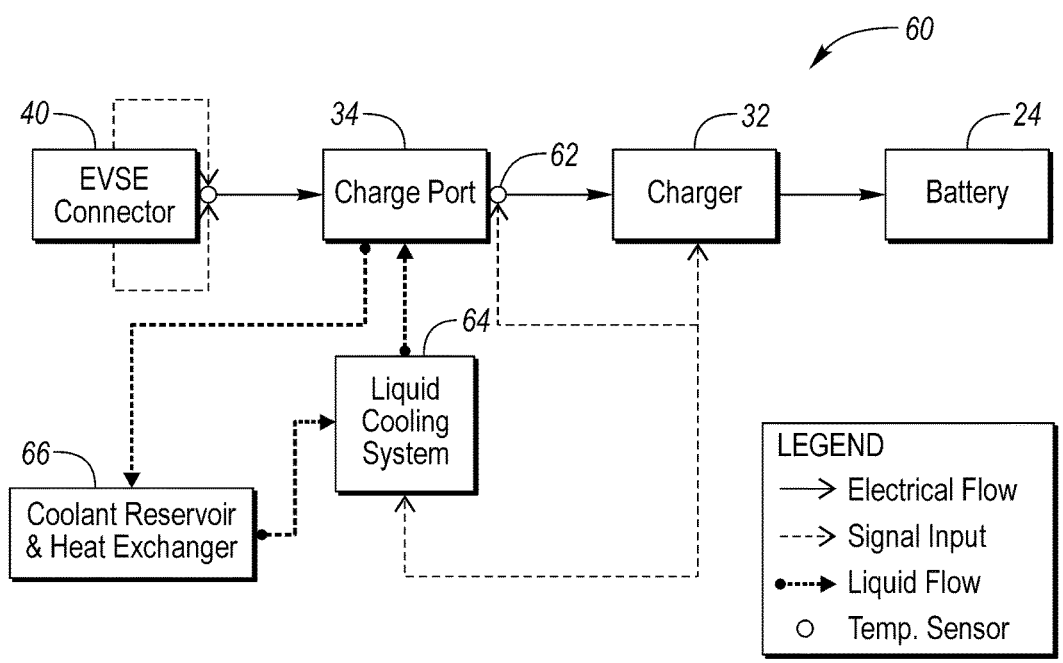
FIG. 3 illustrates a block diagram of a liquid cooling configuration for cooling the charge port.

Referring now to FIG. 3, with continual reference to FIG. 1, a block diagram of a liquid cooled configuration 60 for cooling charge port 34 is shown. During the conductive charging process, charging current is conductively transferred through the mated charge connector 40 and charge port 34 to on-board charger 32 and battery 24. The flow of the charging current is indicated by the "Electrical Flow" straight line segments shown in FIG. 3 between charge connector 40, charge port 34, charger 32, and battery 24. The charging current may be a relatively high DC current conducted through charge port 34. The peak charging current may occur during the initial portion of the battery charge cycle. As such, charge port 34 may experience the highest temperature rise during this phase.

As further shown in FIG. 3, charge port 34 includes an associated temperature sensor 62. (Charge connector 40 may also include an associated temperature sensor (not labeled).) Temperature sensor 62 of charge port 34 is part of a temperature monitoring system which may enable system shut-down or current de-rating when charge port 34 registers a temperature rise value exceeding a threshold temperature. Such shut-down or de-rating signal may be commanded by charger 32 depending on vehicle architecture. In this regard, temperature sensor 62 provides a temperature signal indicative of the temperature of charge port 34 to charger 32. This is indicated by the "Signal Input" dashed line extending from temperature sensor 62 to charger 32 shown in FIG. 3.

Liquid cooled configuration 60 includes a liquid cooling system 64 and an associated coolant reservoir and heat exchanger 66. Liquid cooling system 64 includes a cold plate assembly integrated onto charge port 34 (see, for example FIG. 4). The cold plate assembly includes a hardware device such as a relatively small, lite weight, aluminum cold plate mounted onto charge port 34. The cold plate can consist of a fin type or curve channel configuration to provide efficient cooling.

Liquid cooling system 64 is configured to provide a circuitous flow of coolant between liquid cooling system 64, the cold plate on charge port 34, and coolant reservoir and heat exchanger 66. This circuitous flow is indicated by the "Liquid Flow" dotted line segments in FIG. 3. For instance, liquid cooling system 64 further includes a pump or the like for pumping the coolant between coolant reservoir and heat exchanger 66 and the cold plate on charge port 34. In operation, the pump pumps coolant from coolant reservoir and heat exchanger 66 to charge port 34. Heat from charge port 34 thermally conducts through the cold plate to the coolant flowing through the cold plate. The heated coolant is expelled from pumping pressure out of the cold plate to coolant reservoir and heat exchanger 66. Coolant reservoir and heat exchanger 66 includes a manifold system or the like whereby the heated coolant is cooled down. The coolant flow continues in this cycle until the coolant is stopped being pumped.

Liquid cooling system 64 further includes a cooling controller (not shown). Temperature sensor 62 provides the temperature signal indicative of the temperature of charge port 34 to the cooling controller. This is indicated by the "Signal Input" dashed line extending from temperature sensor 62 to liquid cooled system 64 shown in FIG. 3. The cooling controller controls the pumping of liquid cooling system 64 to enable the flow of coolant according to the temperature of charge port 34. For instance, the cooling controller enables the coolant flow while the temperature of charge port 34 exceeds a threshold.

Figure 4:
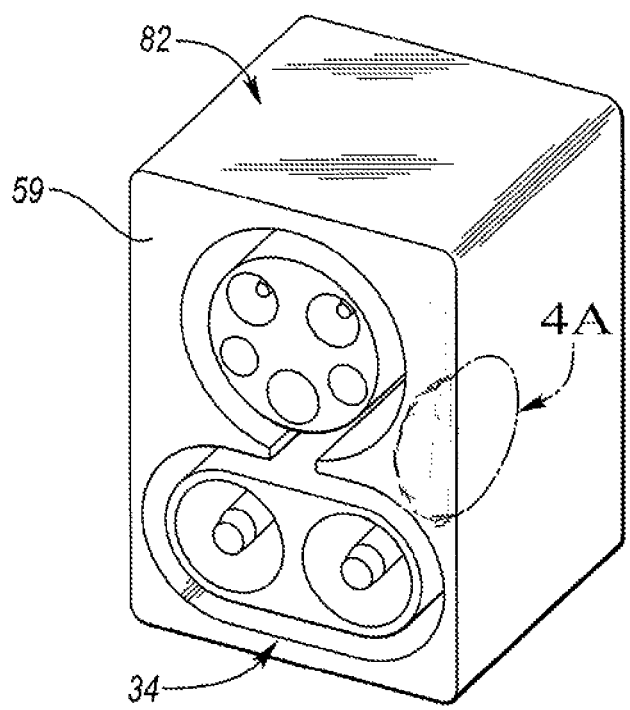
FIG. 4 illustrates an assembly diagram of a cold plate assembly attached to the charge port according to the liquid cooled configuration.

Referring now to FIG. 4, with continual reference to FIGS. 2 and 3, an assembly diagram of a cold plate assembly 82 attached to charge port 34 according to liquid cooled configuration 60 is shown. As shown in FIG. 4, as an example, cold plate assembly 82 encases a portion of housing 59 of charge port 34. Of course, the front side of charge port 34 is left accessible for access to connect with charge connector 40. Likewise, the rear side of charge port 34 is left accessible for cabling to extend between the charge port pins and on-board charger 32.

Figure 4A:
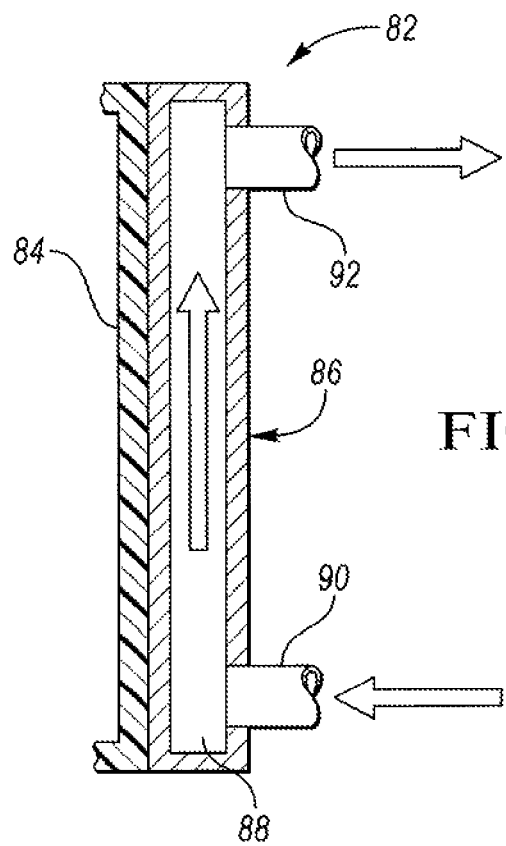
FIG. 4A is a cross-sectional diagram of a portion of the cold plate assembly of the circled area 4A shown in FIG. 4.

FIG. 4A is a cross-sectional diagram of a portion of cold plate assembly 82 of the circled area 4A shown in FIG. 4. As shown in FIG. 4A, cold plate assembly 82 includes a substrate 84 and a liquid-cooled cold plate 86. Substrate 84 meets and encases the portion of charge port 34. Cold plate 86 includes a fluid chamber 88 having a fluid ingress port 90 and a fluid egress port 92. Coolant pumped by the pump of liquid cooling system 64 enters ingress port 90, flows through cold plate chamber 88, and exits out of egress port 92 to coolant reservoir and heat exchanger 66. Heat from substrate 84 caused by the charging current conducted through charge port 34 thermally conducts through cold plate 86 to the coolant flowing through cold plate chamber 88. The heated coolant exits out of egress port 92 to coolant reservoir and heat exchanger 66 where the heated coolant is cooled down.

Figure 5:
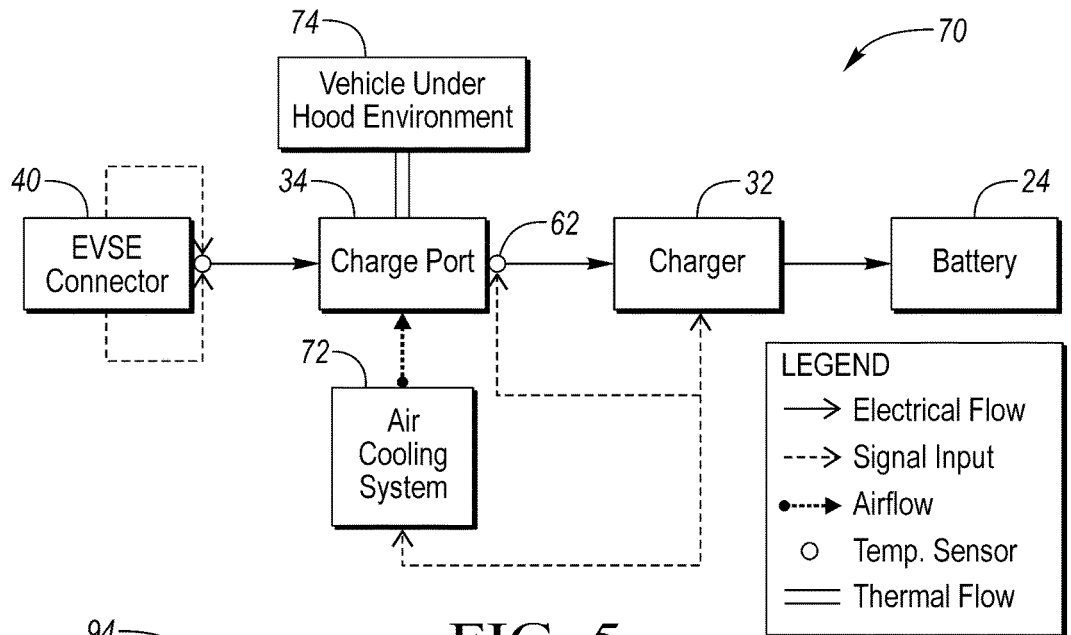
FIG. 5 illustrates a block diagram of an air cooled configuration for cooling the charge port.

Referring now to FIG. 5, with continual reference to FIGS. 1 and 3, a block diagram of an air cooled configuration 70 for cooling charge port 34 is shown. Again, during the conductive charging process, charging current is conductively transferred through the mated charge connector 40 and charge port 34 to charger 32 and battery 24. Air cooled configuration 70 includes an air cooling system 72.

In one variation, air cooling system 72 is a forced air cooling system. In this variation, air cooling system 72 is configured to provide a flow of air toward charge port 34. The air flow dissipates heat from charge port 34 onto the vehicle under hood environment 74 where charge port 34 is located. This flow of air is indicated by the "Airflow" dotted line segments in FIG. 5. For instance, in this variation, air cooling system 72 includes a cooling fan or the like configured to provide the flow of air toward charge port 34. In operation, the cooling fan causes air flow from air cooling system 72 to charge port 34. Heat of charge port 34 thermally dissipates into the air flowing by charge port 34. The heated air continues flowing past charge port 34 into the vehicle under hood environment 74 where the heat is dissipated. The dissipation of heated air from charge port 34 into the vehicle under hood environment 74 is indicated by the "Thermal Flow" pipe-line segment shown in FIG. 5.

In another variation, air cooling system 72 is a natural air convection system. In this variation, air cooling system 72 includes a heat-sink device(s) integrated onto charge port 34.

In general, the heat-sink devices absorb heat from charge port 34. Heat from the heated heat-sink devices is dissipated into the vehicle under hood environment 74 where charge port 34 is located. The dissipation of heat from the heated heat-sink devices into the vehicle under hood environment 74 is indicated by the "Thermal Flow" pipe-line segment shown in FIG. 5.

In another variation, air cooling system 72 is a combined forced air/natural air convection system. In this variation, air cooling system 72 includes both of a cooling fan or the like configured to provide air flow toward charge port 34 and a heat-sink device(s) integrated onto charge port 34.

Figure 6A:
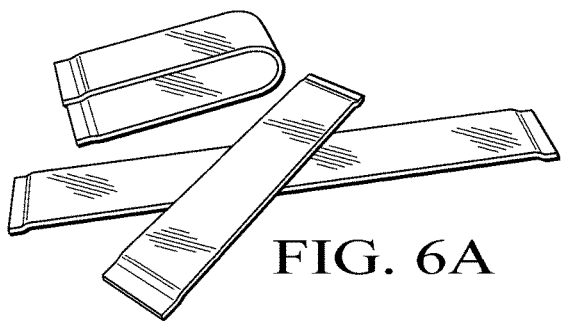
FIGS. 6A, 6B, and 6C respectively illustrate assembly diagrams of heat-sink devices for attachment to the charge port according to the natural air convection system of the air cooled configuration.
Figure 6B:
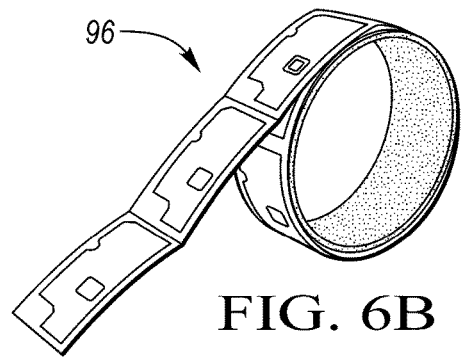
Figure 6C:
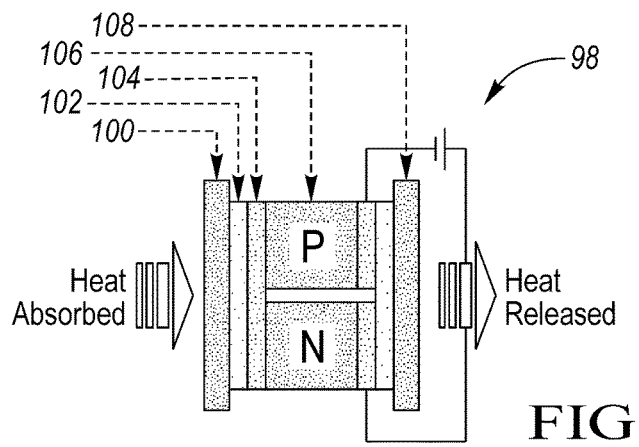

Referring now to FIGS. 6A, 6B, and 6C, with continual reference to FIG. 2, assembly diagrams of heat-sink devices for attachment to charge port 34 according to the natural air convection system of the air cooled configuration are shown. As shown in FIG. 6A, a heat-sink device may include bendable flat heat pipes 94. Heat pipes 94 can be used to transfer localized heat generated at the pin-cable termination interface of charge port 34 to a heat spreader. As shown in FIG. 6B, a heat-sink device may include thin flexible heat spreaders 96. Heat spreaders 96 can be used to eliminate localized hot spots of charge port 34 and improve charging performance. Heat spreaders 96 may be formed from graphite as natural graphite exhibits higher thermal conductivity than copper or aluminum.

As shown in FIG. 6C, a heat-sink device may take the form of a thermoelectric cooling module 98 such as a Peltier device. Cooling module 98 encases a portion of housing 59 of charge port 34 in a manner similar to cold plate assembly 82. As shown in FIG. 6C, cooling module 98 includes a cooling plate 100, an insulator 102, a conducting material 104, a P/N semiconductor 106, and a heat sink 108. Heat from charge port 34 is absorbed by cooling plate 100 and through the operation of cooling module 98 is released such as into the vehicle under hood environment.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An assembly for charging a traction battery of a vehicle, comprising:
   a charge port having input and output connection interfaces and configured to conductively transfer charging current via the connection interfaces from an external source to the vehicle;
   a cold plate entirely encasing the charge port except for the connection interfaces, the cold plate having a chamber,
   a cooling system configured to provide coolant through the chamber to cool the charge port.

2. The assembly of claim 1 wherein:
   the cooling system includes a temperature sensor configured to monitor a temperature of the charge port; and
   the cooling system is further configured to provide coolant through the chamber to cool the charge port depending on the temperature of the charge port.

3. The assembly of claim 1 wherein:
   the chamber of the cold plate includes a coolant ingress port and a coolant egress port both in fluid communication with the cooling system.

4. The assembly of claim 3 wherein:
   the cooling system further includes a heat exchanger configured to cool heated coolant.

5. A vehicle comprising:
   a traction battery;
   a charge port having input and output connection interfaces and configured to conductively transfer charging current via the connection interfaces from an external source to the traction battery;
   a cold plate entirely encasing the charge port except for the connection interfaces, the cold plate having a chamber;
   a cooling system configured to provide coolant through the chamber to cool the charge port.

6. The vehicle of claim 5 wherein:
   the cooling system includes a temperature sensor configured to monitor a temperature of the charge port; and
   the cooling system is further configured to provide coolant through the chamber to cool the charge port depending on the temperature of the charge port.

7. The vehicle of claim 5 wherein:
   the chamber of the cold plate includes a coolant ingress port and a coolant egress port both in fluid communication with the cooling system.

8. An assembly for a vehicle, comprising:
   a charge port having input and output connection interfaces, the output connection interface connected to an on-board charger of the vehicle which is connected to a traction battery of the vehicle, the charge port configured to conductively transfer electrical current via the connection interfaces from an external source to the on-board charter, for charging the traction battery, when a charge connector of the external source is plugged into the input connection interface;
   a cold plate entirely encasing the charge port except for the connection interfaces, the cold plate having a chamber,
   a cooling system configured to provide coolant through the chamber to cool the charge port.

9. The assembly of claim 8 wherein:
   the cooling system includes a temperature sensor configured to monitor a temperature of the charge port; and
   the cooling system is further configured to provide coolant through the chamber to cool the charge port depending on the temperature of the charge port.

10. The assembly of claim 8 wherein:
    the chamber of the cold plate includes a coolant ingress port and a coolant egress port both in fluid communication with the cooling system.

* * * * *